United States Patent [19]
Davis

[11] Patent Number: 5,381,061
[45] Date of Patent: Jan. 10, 1995

[54] OVERVOLTAGE TOLERANT OUTPUT BUFFER CIRCUIT

[75] Inventor: Jeffrey B. Davis, Raymond, Me.

[73] Assignee: National Semiconductor Corporation, Santa Clara, Calif.

[21] Appl. No.: 24,942

[22] Filed: Mar. 2, 1993

[51] Int. Cl.⁶ .............. H03K 19/0175; H03K 19/0948
[52] U.S. Cl. ..................... 326/57; 326/68; 326/121; 327/534
[58] Field of Search ............... 307/475, 451, 443, 473, 307/296.2

[56] References Cited
U.S. PATENT DOCUMENTS

| | | | |
|---|---|---|---|
| 4,670,668 | 2/1987 | Liu . | |
| 4,670,861 | 9/1987 | Shu et al. | 365/181 |
| 4,864,373 | 4/1989 | Miyashita | 357/23.5 |
| 4,906,056 | 11/1990 | Taniguchi | 307/482 |
| 5,004,936 | 4/1991 | Andresen | 307/451 |
| 5,060,044 | 2/1991 | Tomassetti | 357/43 |
| 5,117,129 | 3/1992 | Hoffman et al. | 307/443 |
| 5,144,165 | 9/1992 | Dhong et al. | 307/451 |
| 5,160,855 | 11/1992 | Dobberpuhl | 307/296.2 |
| 5,266,849 | 11/1993 | Kitahara et al. | 307/475 |

Primary Examiner—Edward P. Westin
Assistant Examiner—Jon Santamauro
Attorney, Agent, or Firm—Daniel H. Kane; Stephen R. Robinson; Richard C. Calderwood

[57] ABSTRACT

A tristate output buffer circuit provides overvoltage protection from voltage signals on a common bus having a higher voltage level than the internal high potential power rail of the tristate output buffer circuit. A high potential level pseudorail (PV) is coupled to the NWELL of a P channel output pullup transistor (P4). A comparator circuit (P5,P6) couplings the pseudorail (PV) to the output (VOUT). The comparator circuit passgates (P5,P6) are constructed to couple the pseudorail (PV) to the high potential power rail (VCC) for VOUT<VCC and to couple the pseudorail (PV) to the output (VOUT) for VOUT>VCC. A feedback transistor (P1) couples the pseudorail (PV) to an internal node of the tristate output buffer circuit at the control gate node of the output pullup transistor (P4). The feedback transistor (P1) control gate node is coupled to a tristate enable input (EN) for turning on the feedback transistor (P1) during the tristate operating mode and holding off the output pullup transistor (P4). At least one N channel pullup transistor (N1,N2) is coupled between the control gate node of the output pullup transistor (P4) and high potential power rail (VCC) to isolate overvoltage at the internal node from the high potential power rail (VCC). The N channel pullup transistors (N1,N2) are selected to have a turn on voltage threshold VTN less than the absolute value of the turn on voltage threshold VTP of the P channel output pullup transistor.

29 Claims, 1 Drawing Sheet

OVERVOLTAGE TOLERANT OUTPUT BUFFER CIRCUIT

TECHNICAL FIELD

This invention relates to a new tristate output buffer circuit applicable for multiple output buffer circuit systems driving a common external bus. The invention permits multiple output buffer circuits with multiple incompatible power supplies to operate on the common external bus. For example, the invention provides overvoltage protection for output driver circuits operating with the new JEDEC Standard 8-1A 3.3 v power supply from 5 volt signals applied on the common bus by output buffer circuits operating with JEDEC Standard 18 and 20 5 v power supplies. The protected tristate output buffer circuit of the present invention is particularly applicable for use in notebook, note pad, and personal digital assistant personal computers that utilize the new 3.3 v power supply standard but which must also operate with peripheral equipment that utilizes the 5 v standard power supply.

BACKGROUND ART

In 1992 the Joint Electron Device Engineering Council (JEDEC) of the Electronic Industries Association (EIA) passed a new low voltage integrated circuit standard based on a 3.3 v nominal power supply. This new low voltage standard is designated the JEDEC Standard 8-1A and is now commonly known as the 3 v standard. The new JEDEC Standard 8-1A at nominal 3.3 v is incompatible with the conventional integrated circuit JEDEC Standards 18 and 20 specifying a 5 v power supply.

In NWELL CMOS technology, the P channel or PMOS transistors are formed with P source and drain regions formed in an NWELL which is in turn formed in a grounded P type substrate. The NWELL of a PMOS output pullup transistor of the output buffer circuit is coupled to the high potential power rail VCC. If a standard output buffer circuit supplied by the new 3.3 v standard power supply has a 5 v signal applied to its output from the common external bus, the PN junction between the P drain and NWELL will forward bias. This creates a low impedance path from the 5 v common external bus, to the internal 3.3 v power rail with disruptive effects. It is therefore generally not allowed to have on a common external bus multiple tristate output buffer circuits with incompatible power supplies.

One solution to this problem is described in the related David H. Larsen and James B. Boomer U.S. patent application Ser. No. 08/016,009, filed Feb. 10, 1993 for FULL SWING POWER DOWN BUFFER CIRCUIT WITH MULTIPLE POWER SUPPLY ISOLATION. According to the Larsen and Boomer invention there is provided a P channel NWELL isolation switch transistor PW1 having a primary current path coupled between the NWELL of the pullup output transistor and the high potential power rail VCC. The NWELL isolation switch transistor PW1 has a control node coupled in the buffer circuit to the control node of the pullup output transistor for controlling the conducting state of the NWELL isolation switch transistor PW1 substantially in phase with the output pullup transistor. The NWELL of the pullup output transistor is thereby isolated from the high potential power rail VCC when the pullup output transistor is not conducting. The NWELL, isolation switch transistor PW1 avoids the leakage path from a 5 volt signal on the common output bus to the 3.3 v internal power supply rail of a quiet 3.3 v standard output buffer circuit on the common bus. As a result both 3.3 v and 5 v subsystems and output buffer circuits may coexist in the same common bus of a multiple output buffer circuit system.

Another solution is provided in the related Joseph D. Wert et al. U.S. patent application Ser. No. 08/073,376, filed Jun. 7,1993 for OVERVOLTAGE PROTECTION BACKGATE BIAS SWITCHING CIRCUIT. According to the Wert et al. invention a 3.3 v/5 v backgate bias switching circuit or NWELL supply switching circuit is coupled between the output and the NWELL of the output buffer circuit output pullup transistor. Two P channel or PMOS transistors are coupled in series between the 3.3 v internal power supply rail and the output. The intermediate node between the two series coupled PMOS transistors is coupled to the NWELL of the output pullup transistor. A P channel passthrough gate transistor is also coupled between the intermediate node and the gate node of the output pullup transistor. By this arrangement, when the 3.3 v supply rail is applied at the gate node of the output pullup transistor, it is also applied at the NWELL. Similarly if a 5 v signal on the common bus finds its way to the gate node of the output pullup transistor, the 5 v signal is also applied to the NWELL. By this effective switching of the power supply applied to the NWELL of the output pullup transistor to match the signal at the drain node, a destructive leakage path between the 5 v common bus and 3.3 v internal power supply rail is avoided.

OBJECTS OF THE INVENTION

It is an object of the present invention to provide an improvement upon these circuit solutions for overvoltage protection in multiple output buffer circuit systems with multiple incompatible power supplies.

Another object of the invention is to provide a new overvoltage tolerant tristate output buffer circuit with increased protection and isolation of a lower voltage internal power supply rail such as a 3.3 v standard power supply rail from overvoltage signals such as 5 v signals on internal nodes of the output buffer circuit.

A further object of the invention is to provide an overvoltage tolerant tristate output buffer circuit with pullup enhancement circuits to improve turn off of a PMOS output pullup transistor and turn on of an NMOS output pulldown transistor.

DISCLOSURE OF THE INVENTION

In order to accomplish these results the invention provides a high potential level pseudorail coupled at the NWELL of the P channel output pullup transistor. A comparator circuit couples the pseudorail to the output. The comparator circuit includes passgates constructed to couple the pseudorail to the high potential power rail if the voltage level at the output is less than the voltage level of the high potential power rail (VOUT<VCC). The passgates also couple the pseudorail to the output if the voltage level at the output is greater than the voltage level of the high potential power rail (VOUT>VCC).

A feedback transistor couples the pseudorail to an internal node of the tristate buffer circuit at the control gate node of the output pullup transistor. The feedback transistor has a control gate node coupled to a tristate enable input for turning on the feedback transistor during the tristate operating mode and holding off the output pullup transistor.

According to the invention at least one N channel pullup transistor is coupled between the control gate node of the output pullup transistor and the high potential power rail to isolate overvoltage signals at the internal node from the high potential power rail. A first N channel pullup transistor has a control gate node coupled to the input. The N channel pullup transistors are selected to have a relatively small turn on threshold voltage VTN less than the absolute value of the turn on voltage threshold VTP of the P channel output pullup transistor, i.e. VTN<|VTP|. The selection of N channel transistors enhances turn off of the output pullup transistor when driving a low potential level signal at the output.

The new tristate output buffer circuit also includes a pulldown enhancement circuit coupled between the pseudorail and a control gate node of the output pulldown transistor. The pulldown enhancement circuit pulls up the control gate node to the potential level of the pseudorail when driving a logic low potential level signal at the output.

According to a preferred embodiment a first N channel pullup transistor coupled between the high potential power rail and control gate node of the output pullup transistor has a control gate node coupled to the input of the tristate output buffer circuit. A second N channel pullup transistor has a control gate node coupled to a complementary tristate enable input. A third N channel transistor is coupled to the feedback transistor in an inverter stage. The inverter stage has an input coupled to the tristate enable input and an output coupled to the control gate node of the output pullup transistor for implementing the tristate operating mode. Importantly, the third N channel transistor has a source coupled to the control gate node of the output pulldown transistor to isolate an overvoltage signal at the control gate node from the high potential power rail. All three N channel transistors are selected to have a turn on voltage threshold VTN less than the absolute value of the turn on voltage threshold VTP of the PMOS output pullup transistor. VTN may be reduced by utilizing an additional threshold adjust step during processing to create a set of low VTN devices with VTN<|VTP| without changing any device parameters for NMOS transistors that are used elsewhere in the circuit.

In the preferred example the comparator circuit includes a first P channel passgate coupled between the pseudorail and output having a control gate node coupled to the high potential power rail. The first passgate passes the voltage level at the output to the pseudorail when the voltage level at the output is greater than the high potential power rail voltage level (VOUT>VCC). A second P channel passgate is coupled between the high potential power rail and pseudorail and has a control gate node coupled to the output. The second passgate passes the high potential power rail voltage level to the pseudorail when the voltage level at the output is less than the high potential power rail voltage level (VOUT<VCC). In the preferred example the first and second channel passgates have NWELL's or backgates coupled to the pseudorail.

Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
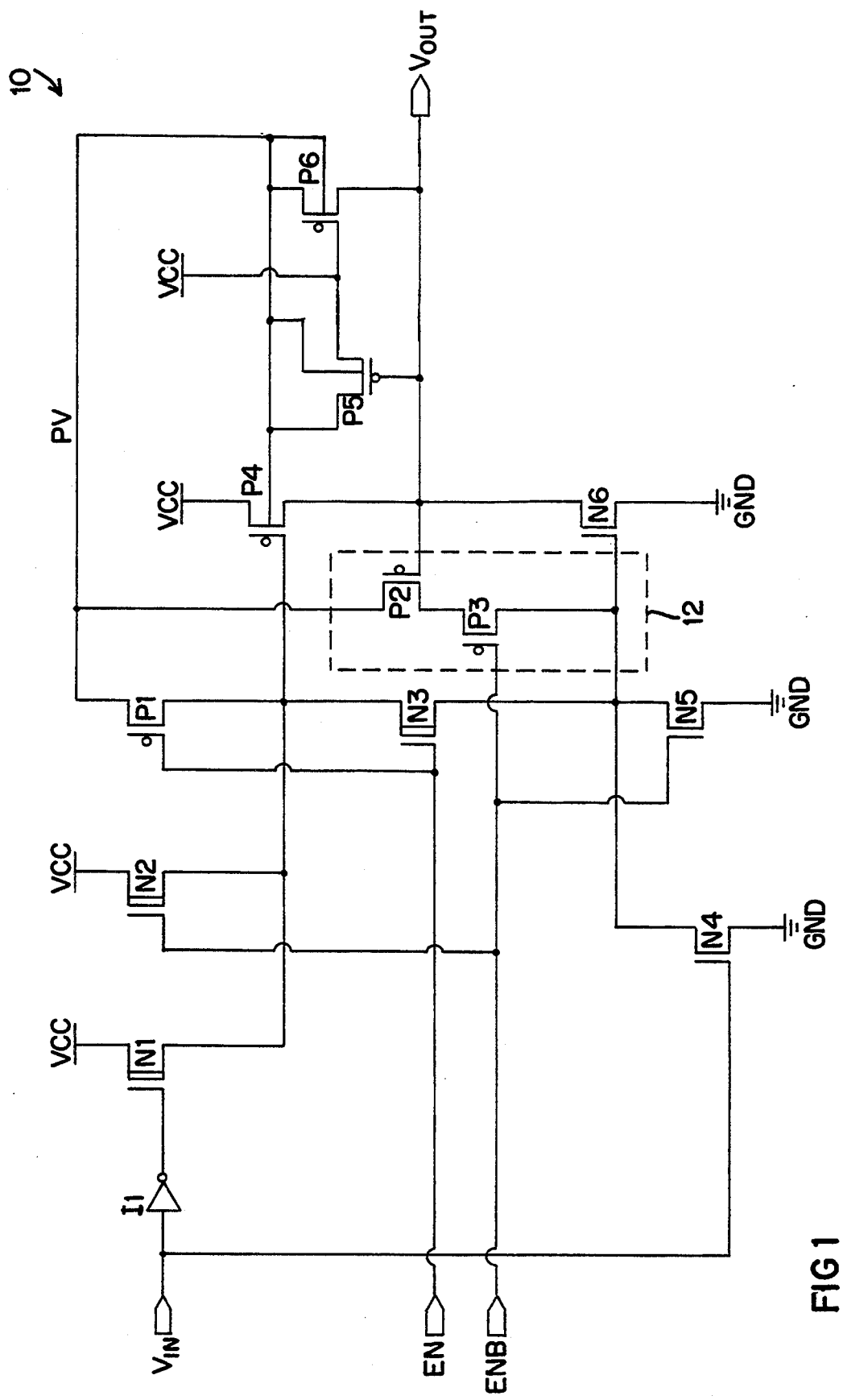
FIG. 1 is a schematic circuit diagram of a new tristate output buffer circuit with overvoltage protection according to the invention.

A tristate output buffer circuit 10 with overvoltage protection according to the invention is illustrated in FIG. 1. Data signals of logic high and low potential levels are applied at the input $V_{IN}$ for driving output signals at the output VOUT. The output VOUT is coupled to a common external bus with other tristate output buffer circuits. Input signals are divided into a pullup circuit path through a pullup predriver inverter stage I1, and into a pulldown circuit path through pulldown predriver inverting transistor N4. A PMOS output pullup transistor P4 is coupled between the internal high potential power rail VCC and the output VOUT for sourcing current from a 3.3 v standard power supply VCC to the output VOUT during the normal bistate operating mode. An NMOS output pulldown transistor N6 is coupled between the output VOUT and low potential power rail GND for sinking current from the output during the normal bistate operating mode.

The output buffer circuit also incorporates tristate enable circuitry with complementary tristate enable inputs EN and ENB. The complementary tristate enable inputs EN and ENB are coupled to tristate implementing transistors N2,N3, and N5 for implementing the high impedance third state at the output VOUT. The complementary tristate enable signal inputs EN,ENB are also coupled to two additional PMOS transistors P1,P3 which perform other novel circuit functions as hereafter described.

The tristate output buffer circuit 10 is provided with a high potential pseudorail PV coupled to the NWELL of the P channel output pullup transistor P4. A comparator circuit P5,P6 is coupled between the pseudorail PV and output VOUT. The comparator circuit consists of a first PMOS transistor passgate P6 coupled between the pseudorail PV and output VOUT. The gate node of passgate P6 is coupled to the internal high potential power rail VCC at 3.3 v. Therefore if a voltage signal appears at the output VOUT having a voltage level greater than VCC, that is, greater than approximately 3.3 v±0.3 v, for example a 5 volt signal driven by a 5 v standard tristate output buffer circuit on the common external bus, the passgate P6 becomes conducting and applies its drain voltage level to the pseudorail PV. Thus, for VOUT>VCC, PV=VOUT. The second PMOS transistor passgate P5 is coupled between the pseudorail PV and internal high potential power rail VCC. The gate node of passgate P5 is coupled to the output VOUT. Therefore, for voltage signals at the output VOUT having a voltage level less than VCC, passgate P6 is held off while passgate P5 becomes conducting. Passgate P5 applies the internal high potential power rail voltage level of nominal 3.3 v with an actual range of approximately 3.3 v±0.3 v, to the pseudorail PV. Thus for VOUT<VCC, PV=VCC. For VOUT=VCC, the pseudorail PV is in a high impedance Z condition.

As shown in FIG. 1 the NWELL's or backgates of the P channel passgate transistors P5 and P6 are both connected to PV. The NWELL voltage therefore coincides with the source voltages to prevent forward biasing of leakage current paths from an overvoltage signal at the output VOUT to the internal high potential power rail VCC.

When an overvoltage signal such as a 5 volt signal appears at the output VOUT the 5 volt signal appears at the drain of P channel output pullup transistor P4. A leakage current path would otherwise be available through the forward biased junction at the drain of P4 to its NWELL which is charged to the internal high potential rail VCC in conventional circuits. However because of the comparator circuit, the 5 volt signal is also applied at the pseudorail PV which is coupled to the NWELL of output pullup transistor P4 in the new output buffer circuit 10 as shown in FIG. 1. The matching of voltages applied at the drain node and NWELL or backgate of P channel pullup transistor P4 eliminates any forward bias diode junction leakage path and thereby isolates the 3.3 v internal power rail VCC from the 5 volt overvoltage signal at the output VOUT.

The pseudorail PV is also coupled to an internal node of the output buffer circuit namely the control gate node of output pullup transistor P4 through PMOS feedback transistor P1. The control gate node of feedback transistor P1 is coupled to the tristate enable input EN. When a 5 volt signal at the output VOUT is applied to the pseudorail PV by comparator circuit passgate P6, feedback transistor P1 applies the high potential level 5 volt signal to the gate node holding off PMOS output pullup transistor P4. During the tristate operating mode with a high impedance third state at the output VOUT, the tristate enable signal input EN is low while the complementary tristate enable signal input ENB is high. The inverter gate formed by transistors P1/N3 then holds off the output pullup transistor P4. At the same time tristate transistor N5 discharges and holds off the output pulldown transistor N6.

Because a 5 volt overvoltage signal may appear at the control gate node of output pullup transistor P4, pullup transistors for the gate node are provided by N channel transistors N1 and N2 instead of conventional P channel pullup transistors. N channel pullup transistor N1 prevents the internal power rail VCC from being charged above VCC by the 5 volt signal applied to the gate of P4. Similarly tristate pullup transistor N2 is an N channel transistor for isolating the internal power supply rail VCC from an overvoltage signal at the internal node.

A difficulty with conventional N channel pullup transistors is that they may not charge up the gate node of the output transistor P4 to a voltage level greater than VTP of P4. N channel pullup transistors N1 and N2 are therefore fabricated in a CMOS fabricating process which yields N channel pullup transistors N1,N2 having a relatively small turn on voltage threshold VTN less than the absolute value of the turn on threshold voltage VTP of the output pullup transistor P4. The condition VTN<|VTP| can also be satisfied by utilizing an additional threshold adjust step to create a set of low VT transistors for the N channel pullup transistors N1,N2. In either case VTN can be reduced from a conventional 0.85 v to for example 0.5–0.6 v. This condition enhances the pullup and turn off of output pullup transistor P4.

Similarly transistor N3 in the normal bistate operating mode with tristate enable input EN high and complementary tristate enable input ENB low, provides only degraded pullup of the pulldown transistor N6. Limitation on the pullup of the voltage at the control gate node of N6 limits turn on of the output pulldown transistor N6 for rapid sinking and discharge of current from the output VOUT. This problem is alleviated by selecting the third N channel transistor N3 also to have a relatively small turn on voltage threshold VTN or by selecting tristate transistor N3 also to be a low VT type N channel transistor. The low VT type N channel transistor symbol is indicated for NMOS transistors N1,N2, and N3 by the extra line in the transistor symbol.

To further supplement turn on of the output pulldown transistor N6 during normal bistate mode operation, an output pulldown transistor pullup enhancement circuit 12 is coupled between the pseudorail PV and control gate node of the output pulldown transistor N6. Pullup enhancement circuit 12 for restoring control gate node voltage to the high potential power rail voltage level is accomplished by two PMOS transistors P2 and P3 coupled in series between the pseudorail PV and control gate node. The gate node of PMOS transistor P2 is coupled to the output while the gate node of PMOS transistor P3 is coupled to the complementary tristate enable input ENB. During normal bistate mode operation with ENB low and driving a logic low potential level signal at the output VOUT, both enhancement circuit transistors P2 and P3 are conducting pulling up the gate node of output pulldown transistor N6 to the voltage level of pseudorail PV which equals VCC. The NWELL's of pullup enhancement transistors P2 and P3 can be tied to the pseudorail PV. The pullup enhancement circuit 12 is an optional circuit and may be omitted from the output buffer circuit.

It is noted that tristate transistor N3 also performs an isolation function isolating the overvoltage signal at the output pulldown transistor gate node from other internal nodes of the tristate output transistor and more importantly the internal high potential power rail. During the normal bistate operating mode pulldown transistors N4 and N5 hold off output pulldown N6 and through tristate transistor N3 turn on output pullup transistor P4 when driving a high potential level signal at the output.

While the invention has been described with reference to particular example embodiments it is intended to cover all modifications and equivalents within the scope of the following claims.

I claim:

1. A tristate output buffer circuit having a data input for receiving input signals and an output for delivering output signals, a P channel output pullup transistor coupled between the output and a high potential power rail and an output pulldown transistor coupled between the output and a low potential power rail for driving output signals on a common bus, said P channel output pullup transistor being formed in an NWELL, said tristate output buffer circuit having complementary tristate enable inputs for implementing a tristate operating mode at the output, the improvement for tolerating overvoltage greater than the high potential power rail voltage level VCC at the output comprising:

a high potential level pseudorail coupled to the NWELL of the P channel output pullup transistor;

a comparator circuit coupling the pseudorail to the output, said comparator circuit comprising passgates constructed to couple the pseudorail to the high potential power rail if the voltage level at the output (VOUT) is less than the voltage level of the high potential power rail (VOUT<VCC) and to couple the pseudorail to the output if the voltage level at the output is greater than the voltage level of the high potential power rail (VOUT>VCC);

a feedback transistor coupling the pseudorail to an internal node of the tristate output buffer circuit at the control gate node of the output pullup transistor, said feedback transistor having a control gate node coupled to one of the complementary tristate enable inputs for turning on the feedback transistor during the tristate operating mode and holding off the output pullup transistor;

at least one N channel pullup transistor coupled between said control gate node of the output pullup transistor and high potential power rail to isolate overvoltage at said internal node from the high potential power rail, said N channel pullup transistor having a control gate node coupled to the input and being selected to have a relatively small turn on voltage threshold less than the absolute value of the turn on voltage threshold of the P channel output pullup transistor to enhance turn off of the output pullup transistor when driving a low potential level signal at the output.

2. The tristate output buffer circuit of claim 1 comprising a pulldown enhancer circuit coupled between the pseudorail and a control gate node of the output pulldown transistor for pulling up said control gate node to the potential level of the pseudorail when driving a logic low potential level signal at the output.

3. The tristate output buffer circuit of claim 1 wherein the at least one N channel pullup transistor is a depletion type N channel transistor.

4. The tristate output buffer circuit of claim 1 comprising first and second N channel pullup transistors, said first N channel pullup transistor having a control gate node coupled to the input and said second N channel pullup transistor having a control gate node coupled to the other of the complementary tristate enable inputs.

5. The tristate output buffer circuit of claim 4 comprising a third N channel transistor coupled to the feedback transistor in an inverter stage, said inverter stage having an input coupled to one of the complementary tristate enable inputs and an output coupled to the control gate node of the output pullup transistor for implementing the tristate mode, said third N channel transistor having a source node coupled to the control gate node of the output pulldown transistor for isolating an overvoltage signal at said control gate node from the high potential power rail.

6. The tristate output buffer circuit of claim 5 wherein the first and second N channel pullup transistors and the third N channel transistor have a relatively small turn on voltage threshold.

7. The tristate output buffer circuit of claim 1 wherein the comparator circuit comprises a first P channel passgate coupled between the pseudorail and output and having control gate node coupled to the high potential power rail for passing the voltage level at the output to the pseudorail when the voltage level at the output is greater than the high potential power rail voltage level (VOUT>VCC).

8. The tristate output buffer circuit of claim 7 wherein the comparator circuit comprises a second P channel passgate coupled between the high potential power rail and pseudorail and having a control gate node coupled to the output for passing the high potential power rail voltage level to the pseudorail when the voltage level at the output is less than the high potential power rail voltage level (VOUT<VCC).

9. The tristate output buffer circuit of claim 8 wherein the first and second P channel passgates have NWELL's coupled to the pseudorail node.

10. The tristate output buffer circuit of claim 2 wherein the pulldown enhancement circuit comprises first and second P channel transistors coupled in series between the pseudorail and control gate node of the output pulldown transistor, said first P channel transistor having a control gate node coupled to the output and said second P channel transistor having a control gate node coupled to the other of the complementary tristate enable inputs.

11. The tristate output buffer circuit of claim 1 wherein the high potential power rail voltage level comprises a JEDEC Standard 8-1A 3.3 v power supply and wherein 5 v standard power supply output buffer circuits are also coupled to the common bus.

12. The tristate output buffer circuit of claim 7 wherein the high potential power rail voltage level is a JEDEC Standard 8-1A 3.3 v power supply and wherein the comparator circuit is constructed to pass approximately 3.3 v±0.3 v to the pseudorail for VOUT<3.3 v±0.3 v and wherein the comparator is constructed to pass the output voltage VOUT to the pseudorail for VOUT>3.3 v±0.3v.

13. The tristate output buffer circuit of claim 12 wherein 5 v standard power supply output buffer circuits are also coupled to the common bus.

14. A tristate output buffer circuit having a data input for receiving input signals and an output for delivering output signals, a P channel output pullup transistor coupled between an output and a high potential power rail and an output pulldown transistor coupled between the output and a low potential power rail for driving output signals on a common bus, said P channel output pullup transistor being formed in an NWELL, said tristate output buffer circuit having complementary tristate enable inputs for implementing a tristate operating mode at the output, the improvement for tolerating overvoltage greater than the high potential power rail voltage level (VCC) at the output comprising:

a high potential level pseudorail coupled to the NWELL of the P channel output pullup transistor;

a comparator circuit coupling the pseudorail to the output, said comparator circuit comprising passgates constructed to couple the pseudorail to the high potential power rail if the voltage level at the output (VOUT) is less than the voltage level of the high potential power rail (VOUT<VCC) and to couple the pseudorail to the output if the voltage level at the output is greater than the voltage level of the high potential power rail (VOUT>VCC);

a feedback transistor coupling the pseudorail to an internal node of the tristate output buffer circuit at the control gate node of the output pullup transistor, said feedback transistor having a control gate node coupled to one of the complementary tristate enable inputs for turning on the feedback transistor during the tristate operating mode and holding off the output pullup transistor;

first and second N channel pullup transistors coupled between said control gate node of the output pullup transistor and high potential power rail to isolate overvoltage signals at said internal node from the high potential power rail, said first N channel pullup transistor having a control gate node coupled to the input and said second N channel pullup transistor having a control gate node coupled to the other of the complementary tristate enable inputs, said first arid second N channel pullup transistors being selected to have a relatively small turn on voltage threshold less than the absolute value of the turn on voltage threshold of the P channel output pullup transistor to enhance turn off of the output pullup transistor when driving a low potential level signal at the output;

and a pulldown enhancement circuit coupled between the pseudorail and a control gate node of the output pulldown transistor for pulling up said control gate node to the potential level of the pseudorail when driving a logic low potential level signal at the output.

15. The tristate output buffer circuit of claim 14 wherein the first and second N channel pullup transistors have a relatively small turn on voltage threshold.

16. The tristate output buffer circuit of claim 15 comprising a third N channel transistor coupled to the feedback transistor in an inverter stage, said inverter stage having an input coupled to one of the complementary tristate enable inputs and an output coupled to the control gate node of the output pullup transistor for implementing the tristate mode, said third N channel transistor having a source node coupled to the control gate node of the output pulldown transistor for isolating an overvoltage signal at said control gate node from the high potential power rail.

17. The tristate output buffer circuit of claim 14 wherein the comparator circuit comprises a first P channel passgate coupled between the pseudorail and output and having a control gate node coupled to the high potential power rail for passing the voltage level at the output to the pseudorail when the voltage level at the output is greater than the high potential power rail voltage level (VOUT>VCC).

18. The tristate output buffer circuit of claim 17 wherein the comparator circuit comprises a second P channel passgate coupled between the high potential power rail and pseudorail and having a control gate node coupled to the output for passing high potential power rail voltage level to the pseudorail when the voltage level at the output is less than the high potential power rail voltage level (VOUT<VCC).

19. The tristate output buffer circuit of claim 18 wherein the first and second P channel passgates have NWELL's coupled to the pseudorail node.

20. The tristate output buffer circuit of claim 14 wherein the pulldown enhancement circuit comprises first and second P channel transistors coupled in series between the pseudorail and control gate node of the output pulldown transistor, said first P channel transistor having a control gate node coupled to the output and said second P channel transistor having a control gate node coupled to the other of the complementary tristate enable inputs.

21. An output buffer circuit having a data input for receiving input signals and an output for delivering output signals, a P channel output pullup transistor coupled between the output and a high potential power rail and an output pulldown transistor coupled between the output and a low potential power rail for driving output signals on a common bus, said P channel output pullup transistor being formed in an NWELL, the improvement for tolerating overvoltage greater than the high potential power rail voltage level VCC at the output comprising:

a high potential level pseudorail coupled to the NWELL of the P channel output pullup transistor; and a comparator circuit coupling the pseudorail to the output, said comparator circuit comprising passgates constructed to couple the pseudorail to the high potential power rail if the voltage level at the output VOUT is less than the voltage level of the high potential power rail (VOUT<VCC) and to couple the pseudorail to the output if the voltage level at the output is greater than the voltage level of the high potential power rail (VOUT>VCC);

at least one N channel pullup transistor coupled between a control gate node of the output pullup transistor and high potential power rail to is plate overvoltage at said output pullup transistor control gate node from the high potential power rail, said N channel pullup transistor having a control gate node coupled to the input.

22. The output buffer circuit of claim 21 wherein the output buffer circuit is a tristate output buffer circuit having complementary tristate enable inputs for implementing a tristate operating mode at the output, and further comprising:

a feedback transistor coupling the pseudorail to an internal node of the tristate output buffer circuit at a control gate node of the output pullup transistor, said feedback transistor having a control gate node coupled to one of the complementary tristate enable inputs for turning on the feedback transistor during the tristate operating mode and holding off the output pullup transistor.

23. The output buffer circuit of claim 21 wherein said N channel pullup transistor is selected to have a relatively small turn on voltage threshold less than the absolute value of the turn on voltage threshold of the P channel output pullup transistor to enhance turn off of the output pullup transistor when driving a low potential level signal at the output.

24. The output buffer circuit of claim 21 comprising a pulldown enhancer circuit coupled between the pseudorail and a control gate node of the output, pulldown transistor for pulling up said output pulldown transistor control gate node to the potential level of the pseudorail when driving a logic low potential level signal at the output.

25. The output buffer circuit of claim 21 wherein the comparator circuit comprises a first P channel passgate coupled between the pseudorail and output and having a control gate node coupled to the high potential power rail for passing the voltage level at the output to the pseudorail when the voltage level at the output is greater than the high potential power rail voltage level (VOUT>VCC).

26. The output buffer circuit of claim 25 wherein the comparator circuit comprises a second P channel passgate coupled between the high potential power rail and pseudorail and having a control gate node coupled to the output for passing the high potential power rail voltage level to the pseudorail when the voltage level at the output is less than the high potential power rail voltage level (VOUT<VCC).

27. The output buffer circuit of claim 26 wherein the first and second P channel passgates have NWELL's coupled to the pseudorail node.

28. The output buffer circuit of claim 24 wherein the output buffer circuit is a tristate output buffer circuit having complementary tristate enable inputs for implementing a tristate operating mode at the output, and wherein the pulldown enhancement circuit comprises first and second P channel transistors coupled in series between the pseudorail and control gate node of the output pulldown transistor, said first P channel transistor having a control gate node coupled to the output and said second P channel transistor having a control gate node coupled to one of the complementary tristate enable inputs.

29. The output buffer circuit of claim 21 wherein the high potential power rail voltage level comprises a JEDEC Standard 8-1A 3.3 v power supply, wherein 5 v standard power supply output buffer circuits are also coupled to the common bus, wherein the comparator circuit is constructed to pass approximately 3.3 v±0.3 v to the pseudorail for VOUT<3.3 v±0.3 v, and wherein the comparator is constructed to pass the output voltage to the pseudorail for VOUT>3.3 v±0.3 v.

* * * * *